United States Patent
Urushido

(10) Patent No.: US 7,754,501 B2
(45) Date of Patent: Jul. 13, 2010

(54) METHOD FOR MANUFACTURING FERROELECTRIC CAPACITOR

(75) Inventor: Tatsuhiro Urushido, Minowa (JP)

(73) Assignee: Seiko Epson Corporation (JP)

( * ) Notice: Subject to any disclaimer, the term of this patent is extended or adjusted under 35 U.S.C. 154(b) by 63 days.

(21) Appl. No.: 12/125,418

(22) Filed: May 22, 2008

(65) Prior Publication Data
US 2008/0290385 A1    Nov. 27, 2008

(30) Foreign Application Priority Data
May 24, 2007    (JP)    ............... 2007-137685

(51) Int. Cl.
H01L 21/00    (2006.01)
(52) U.S. Cl. .................. 438/3; 438/210; 438/396; 257/E21.008
(58) Field of Classification Search .......... 257/295, 257/296, 532, E27.084, E21.008; 438/3, 438/210, 396
See application file for complete search history.

(56) References Cited

U.S. PATENT DOCUMENTS

| | | | |
|---|---|---|---|
| 4,984,055 A | 1/1991 | Okumura et al. | |
| 6,485,988 B2 | 11/2002 | Ma et al. | |
| 7,183,602 B2 * | 2/2007 | Udayakumar et al. | 257/295 |
| 7,220,600 B2 * | 5/2007 | Summerfelt et al. | 438/3 |
| 7,348,617 B2 | 3/2008 | Kumura et al. | |
| 2005/0054122 A1 * | 3/2005 | Celii et al. | 438/3 |
| 2008/0081380 A1 * | 4/2008 | Celii et al. | 438/3 |
| 2008/0105911 A1 | 5/2008 | Wang | |
| 2008/0173912 A1 | 7/2008 | Kumura et al. | |

FOREIGN PATENT DOCUMENTS

JP    01-138734    5/1989

(Continued)

Primary Examiner—Tuan N. Quach
(74) Attorney, Agent, or Firm—Harness, Dickey & Pierce, P.L.C.

(57) ABSTRACT

A method for manufacturing a ferroelectric capacitor includes the steps of: forming a base dielectric film on a substrate, and forming a first plug conductive section in the base dielectric film at a predetermined position; forming, on the base dielectric film, a charge storage section formed from a lower electrode, a ferroelectric film and an upper electrode; forming a stopper film from an insulation material that covers the charge storage section; forming a hydrogen barrier film that covers the stopper film; forming an interlayer dielectric film on the base dielectric film including the hydrogen barrier film; forming, in the interlayer dielectric film, a first contact hole that exposes the first plug conductive section; forming a second contact hole that exposes the upper electrode of the charge storage section by successively etching the interlayer dielectric film, the hydrogen barrier film and the stopper film by using a resist pattern as a mask, and then removing the resist pattern by a wet cleaning treatment; forming an adhesion layer from a conductive material having hydrogen barrier property inside the second contact hole in a manner to cover an upper surface of the upper electrode; forming a second plug conductive section inside the first contact hole; and forming a third plug conductive section inside the second contact hole, wherein the stopper film is formed from a material having a lower etching rate for a cleaning liquid used for the wet cleaning treatment to remove the resist pattern than an etching rate of the hydrogen barrier film for the cleaning liquid.

6 Claims, 4 Drawing Sheets

FOREIGN PATENT DOCUMENTS

| | | |
|---|---|---|
| JP | 2001-230382 | 8/2001 |
| JP | 2006-294676 | 10/2006 |
| JP | 2006-310637 | 11/2006 |
| JP | 2007-067066 | 3/2007 |
| WO | 2006-134664 | 12/2006 |

* cited by examiner

METHOD FOR MANUFACTURING FERROELECTRIC CAPACITOR

The entire disclosure of Japanese Patent Application No. 2007-137685, filed May 24, 2007 is expressly incorporated by reference herein.

BACKGROUND

1. Technical Field

The present invention relates to methods for manufacturing ferroelectric capacitors, and also relates to ferroelectric capacitors.

2. Related Art

Ferroelectric memory devices (FeRAM) are nonvolatile memory devices that use spontaneous polarization of ferroelectric material and are capable of low voltage and high speed operations, and their memory cells can be each formed from one transistor and one capacitor (1T/1C). Accordingly, ferroelectric memory devices can achieve integration at the same level of that of DRAM, and are therefore expected as large-capacity nonvolatile memories.

Each memory cell of a ferroelectric memory device generally has a stacked structure in which a transistor, a base dielectric film, a charge storage section, an interlayer dielectric film and a wiring layer are successively formed on a substrate. The transistor has a gate electrode and a pair of source and drain regions. For example, the gate electrode is connected a word line provided in the wiring layer, the source region is connected to a bit line provided in the wiring layer, and the drain region is connected to a lower electrode of the charge storage section. Further, an upper electrode of the charge storage section is connected to a ground line. They are connected through plug conductive sections provided in the base dielectric film and the interlayer dielectric film. The memory cell having the structure described above is capable of allowing an electrical current to flow between the pair of source and drain upon application of a voltage to the gate electrode, whereby data (charge) can be written in the charge storage section, or data can be read from the charge storage section.

The aforementioned charge storage section is equipped with a ferroelectric film composed of ferroelectric material between the upper electrode and the lower electrode. The ferroelectric material may be a material having a perovskite type crystal structure represented by a general formula $ABO_3$, and more specifically, may be lead zirconate titanate (Pb (Zi, Ti) $O_3$; hereafter referred to as PZT) and the like. The ferroelectric material is an oxide, and therefore needs care such that the ferroelectric film would not be reduced and thus deteriorated when the ferroelectric memory device is manufactured. A ferroelectric capacitor that may prevent deterioration of its ferroelectric film uses a structure in which a hydrogen barrier film is formed to cover its charge storage section (see, for example, JP-A-2006-310637).

However, in the case of the ferroelectric capacitor described in JP-A-2006-310637, when forming a contact hole over the upper electrode of the charge storage section, and forming a plug conductive section within the contact hole to be electrically connected to the upper electrode, the ferroelectric film may be reduced and deteriorated. More specifically, when the resist pattern that has been used for patterning the contact hole is removed, for example, ashing treatment may be conducted and residues may be removed by wet cleaning treatment. However, in this instance, the opening side wall of the hydrogen barrier film is etched by the cleaning liquid, whereby hollow-out portions (e.g., pits) may be generated. After forming other contact holes for plug conduction sections to be connected to wirings including bit lines, the hollow-out portions may expand and become prominent as a result of etching with the cleaning liquid, and may eventually cause the hydrogen barrier film to peel off from the charge storage section.

When a barrier conductive film (adhesion layer) having hydrogen barrier property is formed inside the contact hole, the peeled portion would deteriorate the coverage property of the barrier conductive film material, which would create weak points in the barrier conductive film. When a plug conductive section is formed inside the contact hole in a reducing atmosphere, the reducing gas may penetrate into the charge storage section through the weak points in the barrier conductive film, and the reducing gas would deteriorate the ferroelectric film.

SUMMARY

In accordance with an advantage of some aspects of the invention, there is provided a ferroelectric capacitor which can prevent formation of a hollow-out portion in the hydrogen barrier film thereby preventing deterioration of the ferroelectric film, and has excellent hysteresis characteristics, and its manufacturing method is also provided.

In accordance with an embodiment of the invention, a method for manufacturing a ferroelectric capacitor includes the steps of: forming a base dielectric film on a substrate, and forming a first plug conductive section in the base dielectric film at a predetermined position; forming, on the base dielectric film, a charge storage section formed from a lower electrode, a ferroelectric film and an upper electrode; forming a stopper film with an insulation material that covers the charge storage section; forming a hydrogen barrier film that covers the stopper film; forming an interlayer dielectric film on the base dielectric film including the hydrogen barrier film; forming, in the interlayer dielectric film, a first contact hole that exposes the first plug conductive section; forming a second contact hole that exposes the upper electrode of the charge storage section by successively etching the interlayer dielectric film, the hydrogen barrier film and the stopper film by using a resist pattern as a mask, and then removing the resist pattern by a wet cleaning treatment; forming an adhesion layer with a conductive material having hydrogen barrier property inside the second contact hole in a manner to cover an upper surface of the upper electrode; forming a second plug conductive section inside the first contact hole; and forming a third plug conductive section inside the second contact hole, wherein the stopper film is formed from a material having a lower etching rate for a cleaning liquid used for the wet cleaning treatment to remove the resist pattern than an etching rate of the hydrogen barrier film for the cleaning liquid.

When the resist pattern is removed, ashing treatment is normally conducted to ash the resist pattern, and the residues are removed by wet cleaning treatment. However, when the hydrogen barrier film is exposed to cleaning liquid used in the wet cleaning treatment, the side wall of the hydrogen barrier film in its opening which is exposed in the second contact hole is etched, and hollow-out portions (pits) or the like are generated in the side wall. According to the method of the embodiment of the invention, the stopper film is formed from a material having a lower etching rate for the cleaning liquid used for the wet cleaning treatment than that of the hydrogen barrier film, in other words, a material that is more difficult to be etched by the cleaning liquid than the material of the hydrogen barrier film. Therefore, in the opening side wall of the stopper film exposed in the second contact hole, occurrence of pits and the like is reduced, compared to the opening side wall of the hydrogen barrier film.

Accordingly, when an adhesion layer that covers the upper electrode of the charge storage section is formed, an excellent adhesion layer without having weak points can be formed, and deterioration of the ferroelectric film in the charge storage section in the step of forming the third plug conductive section is reduced.

More specifically, according to a method in related art, a hollow-out portion is generated in the opening side wall of the hydrogen barrier film that is in contact with the upper electrode, as described above, and the coverage property of the adhesion layer material is deteriorated at this hollow-out portion, and a weak point is created in the adhesion layer. Then, as the third plug conductive section is normally formed in a reducing atmosphere, the reducing gas penetrates through the weak point into the charge storage section, and the ferroelectric film of the charge storage section, which is formed from an oxide, is reduced by the reducing gas and thus deteriorated.

In contrast, according to the method of the embodiment of the invention, generation of hollow-out portions in the opening side wall of the stopper film that is in contact with the upper electrode is reduced, compared to the opening side wall of the hydrogen barrier film, and deterioration of the coverage property of the adhesion layer material in the opening side wall of the stopper film is reduced, such that the adhesion layer with extremely few weak points can be formed at least in the portion that covers the upper electrode. Accordingly, deterioration of the ferroelectric film in the reducing atmosphere at the time of forming the third plug conductive section is reduced.

Furthermore, in the step of forming the stopper film, a material having hydrogen barrier property may preferably be used as the material for the stopper film.

As a result, even when a hollow-out portion is generated in the opening side wall of the hydrogen barrier film, and a weak point is generated in the adhesion layer accordingly, the reducing gas that has passed through the weak point is prevented from penetrating into the charge storage section through the stopper film because the stopper film is formed from a material having hydrogen barrier property. Accordingly, deterioration of the ferroelectric film is further reduced.

Moreover, in the step of forming the stopper film, SiN may preferably be used as the material for the stopper film.

SiN is very difficult to be dissolved in an ordinary cleaning liquid, such as, for example, a mixed solution of ammonia aqueous solution and hydrogen peroxide solution. Therefore, by forming the stopper film from SiN, generation of a hollow-out portion in the opening side wall of the stopper layer can be substantially reduced. Because SiN has hydrogen barrier property, deterioration of the ferroelectric film is substantially reduced, even when weak points are generated in the adhesion layer in portions corresponding to the hollow-out portions in the hydrogen barrier film as described above.

In the step of forming the stopper film, a sputter method may preferably be used as a method for forming the stopper film.

The stopper film can be formed in a non-reducing atmosphere when a sputter method is used, such that the stopper film can be formed without deteriorating the ferroelectric film of the charge storage section in a reducing atmosphere.

The step of forming the second contact hole may preferably be conducted before the step of forming the first contact hole, and a step of conducting anneal treatment in an oxygen atmosphere between the aforementioned steps.

As a result, even when the ferroelectric film of the charge storage section is reduced and deteriorated before the anneal treatment, the ferroelectric film can be thermally oxidized by the anneal treatment whereby oxygen vacancy in the ferroelectric film can be recovered. Accordingly, the ferroelectric film having excellent ferroelectric characteristics can be formed, and the ferroelectric capacitor with excellent hysteresis characteristics can be manufactured.

A ferroelectric capacitor in accordance with an embodiment of the invention includes a base dielectric film formed on a substrate; a first plug conductive section formed in the base dielectric film at a predetermined position; a charge storage section formed on the base dielectric film and formed from a lower electrode, a ferroelectric film and an upper electrode; a stopper film that covers the charge storage section and is composed of a dielectric material; a hydrogen barrier film that covers the stopper film; an interlayer dielectric film that covers the hydrogen barrier film; a second plug conductive section formed in the interlayer dielectric film and electrically connected to the first plug conductive section; a third plug conductive section that penetrates the interlayer dielectric film, the hydrogen barrier film and the stopper film and is electrically connected to the upper electrode; and an adhesion layer that is formed between the upper electrode and the third plug conductive section and is composed of a conductive material having hydrogen barrier property, wherein the third plug conductive section is formed in a second contact hole formed by etching with a resist pattern used as a mask, and the stopper film is formed from a material having a lower etching rate for a cleaning liquid used for wet cleaning treatment to remove the resist pattern than an etching rate of the hydrogen barrier film for the cleaning liquid.

The stopper film is formed from a material having a lower etching rate for the cleaning liquid used for the wet cleaning treatment than that of the hydrogen barrier film, and therefore has fewer occurrences of hollow-out portions than the hydrogen barrier film. Accordingly, occurrence of weak points in the adhesion layer on the upper electrode is reduced, compared to the case where a hydrogen barrier film is formed in contact with the upper electrode of the charge storage section. Accordingly, when the third plug conductive section is formed in a reducing atmosphere, penetration of the reducing atmosphere into the charge storage section through the weak points is reduced. Therefore, although the ferroelectric film of the charge storage section is formed from an oxide, reduction of the oxide is reduced, and the ferroelectric capacitor equipped with this ferroelectric film has excellent hysteresis characteristics.

Also, the stopper film may preferably be formed from SiN. SiN is very difficult to be dissolved in an ordinary cleaning liquid, such as, for example, a mixed solution of ammonia aqueous solution and hydrogen peroxide solution. Therefore, with the stopper film formed from SiN, generation of hollow-out portions in its opening side wall can be substantially reduced, and generation of weak points in the adhesion layer that may be originated from the hollow-out portions can be substantially reduced. Therefore, deterioration of the ferroelectric film can be substantially reduced, as described above. Further, SiN has hydrogen barrier property. Therefore, even when weak points are generated in the adhesion layer due to the formation of the hollow-out portions in the opening side wall of the hydrogen barrier film as described above, the reducing gas, that has passed through the weak points at the time of forming the third plug conductive section, is prevented from passing through the stopper film composed of SiN and penetrating into the charge storage section. Accordingly, deterioration of the ferroelectric film is further reduced.

BRIEF DESCRIPTION OF THE DRAWINGS

FIGS. 4A-4C are cross-sectional views schematically showing steps of the method for manufacturing a ferroelectric capacitor.

DESCRIPTION OF EXEMPLARY EMBODIMENTS

An embodiment of the invention is described below with reference to the accompanying drawings, using a memory cell of a ferroelectric memory device equipped with a ferroelectric capacitor as an example. However, it should be noted that the technical scope of the invention is not limited to the embodiment described below. Also, it should be noted that, although the description below is made with reference to the accompanying drawings, the scale of each of the components illustrated in each of the drawings may be appropriately changed so that each of the components has a recognizable size.

Figure 1:
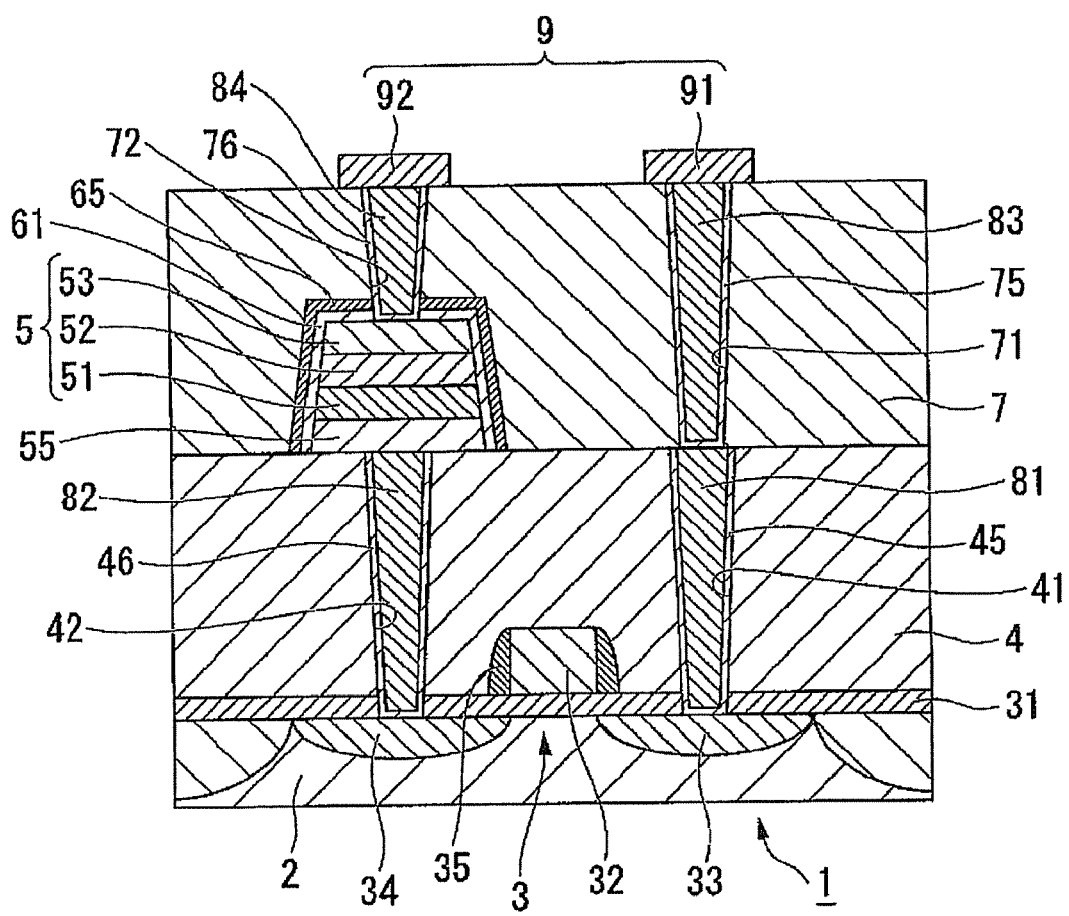
FIG. 1 is a cross-sectional view of the structure of a ferroelectric capacitor.

FIG. 1 is a cross-sectional structural view of a memory cell using a ferroelectric capacitor in accordance with an embodiment of the invention. As shown in FIG. 1, the memory cell 1 is equipped with a switching transistor 3 formed on a semiconductor substrate 2 that may be composed of single crystal silicon or the like, a base dielectric film 4 covering the switching transistor 3, a charge storage section 5 formed on the base dielectric film 4, a stopper film 61 covering the charge storage section 5, a hydrogen barrier film 65 covering the stopper film 61, and an interlayer dielectric film 7 covering the hydrogen barrier film 65. Further, a wiring pattern 9 that may be composed of, for example, aluminum (Al) or the like is formed on the interlayer dielectric film 7, and the wiring pattern 9 includes bit lines 91 and ground lines 92 in accordance with the present embodiment.

The switching transistor 3 is formed from a gate dielectric film 31 that is formed on the substrate 2 composed of silicon by a thermal oxidation method or the like in the present embodiment, a gate electrode 32 composed of polycrystal silicon formed on the gate dielectric film 31, doped regions 33 and 34 formed by an ion implanting method or the like, and a sidewall 35 composed of SiN or the like. In accordance with the present embodiment, the doped region 33 defines a source region, and the doped region 34 defines a drain region. When a voltage is applied to the gate electrode 32 through a word line (not shown), an electrical current can flow from the source region 33 to the drain region 34.

The base dielectric film 4 is composed of, for example, $SiO_2$. A bit line side lower contact hole 41 and a ground line side lower contact hole 42 are formed in a manner to penetrate the base dielectric film 4. Adhesion layers 45 and 46 composed of a conductive material having hydrogen barrier property, such as, for example, Ti, TiN and the like are formed inside the contact holes 41 and 42. Also, plugs 81 and 82 composed of, for example, tungsten or the like are embedded in the contact holes 41 and 42 on the adhesion layers 45 and 46, respectively. In accordance with the present embodiment, as the plugs 81 and 82, a bit line side lower plug 81 in the bit line side lower contact hole 41 and a ground line side lower plug 82 in the ground line side lower contact hole 42 are formed.

The charge storage section 5 includes, for example, a lower electrode 51, a ferroelectric film 52 and an upper electrode 53 sequentially formed on the ground line side lower plug 82 in the base dielectric film 4. Also, in accordance with the present embodiment, a base conductive section 55 is formed between the lower electrode 51 and the ground line side lower plug 82. The base conductive section 55 is composed of TiAlN in accordance with the present embodiment, and electrically connects the ground line side lower plug 82 with the lower electrode 51. Also, TiAlN of the base conductive section 55 has self-orienting property, such that the crystal orientation of the lower electrode 51 can be well aligned. Furthermore, TiAlN of the base conductive section 55 has hydrogen barrier property and oxygen barrier property, such that the lower electrode 51 can be prevented from being reduced, and the ground line side lower plug 82 can be prevented from being oxidized.

The lower electrode 51 includes an iridium (Ir) thin film, an iridium oxide (IrOx) thin film and a platinum (Pt) thin film sequentially laminated on the base conductive section 55, wherein the Ir thin film is connected to the drain region 34 of the switching transistor 3 through the base conductive section 55 and the ground line side lower plug 82. Also, the ferroelectric film 52 is formed from a material having a perovskite crystal structure that is expressed by a general formula $ABO_3$, and may be formed from, for example, PZT (Pb (Zr, Ti) $O_3$), PLZT ((Pb, La) (Zr, Ti) $O_3$), or a ferroelectric material in which metal such as niobate (Nb) or the like is added to the foregoing material. Also, the upper electrode 53 includes a Pt thin film, an IrOx thin film and an Ir thin film sequentially laminated on the ferroelectric film 52, wherein the Ir thin film is connected to the ground line 92 through a ground line side upper plug (third plug conductive section) 84 to be described below. Upon application of a voltage between the lower electrode 51 and the upper electrode 53, an electrical charge can be stored in the ferroelectric film 52 interposed between the electrodes.

The hydrogen barrier film 65 is formed from, for example, aluminum oxide (AlOx), and is capable of preventing the charge storage section 5 from being exposed to reducing gas such as hydrogen gas and steam used when an interlayer dielectric film 7 (to be described below) is formed. Because the ferroelectric film 52 of the charge storage section 5 is formed from oxide material, as described above, its ferroelectric property may be damaged and deteriorated when exposed to reducing gas and being reduced. But the deterioration can be prevented by the hydrogen barrier film 65.

The stopper film 61 is formed from, for example, silicon nitride (SiN). In general, for removing a resist pattern, ashing treatment is applied to the resist pattern to form ash. Then, residues (organic pollutants) are treated and removed by wet cleaning, using, for example, a mixed solution of ammonia aqueous solution and hydrogen peroxide solution as cleaning liquid. SiN is considerably more difficult to be dissolved by such an ordinary cleaning liquid than AlOx, such that the stopper film 61 composed of SiN has a substantially lower etching rate with respect to the cleaning liquid and more difficult to be etched, compared to the hydrogen barrier film 65 composed of AlOx.

The interlayer dielectric film 7 is formed with, for example, TEOS (tetraethoxysilane) or the like as a material. Also, a bit line side upper contact hole (first contact hole) 71 is formed in a position corresponding to the bit line side lower plug 81 in the base dielectric film 4 and a ground line side upper contact hole (second contact hole) 72 is formed above the charge storage section 5. Adhesion layers 75 and 76 composed of conductive material having hydrogen barrier property such as Ti, TiN and the like are formed on the inner walls of the contact holes 71 and 72, respectively, like the adhesion layers 45 and 46. Also, plugs 83 and 84 composed of, for example, tungsten or the like are formed in the contact holes 71 and 72 on the adhesion layers 75 and 76, respectively. In accordance with the present embodiment, as the plugs 83 and 84, a bit line side upper plug (second plug conductive section) 83 in the bit line side upper contact hole 71 and a ground line side upper plug (third plug conductive section) 84 in the ground line side upper contact hole 72 are formed.

According to the present embodiment, the adhesion layer 76 is formed not only between the upper electrode 53 and the third plug conductive section (ground line side upper plug) 84, but also on the inner wall of the ground line side upper contact hole 72, as well as on the inner walls of the contact holes 41, 42 and 71 in addition to the ground line side upper contact hole 72. By the adhesion layers 45, 46, 75 and 76, the adhesion between the plugs 81, 82, 83 and 84 and the inner walls of the contact holes 41, 42, 71 and 72 can be improved. Also, the adhesion layer 76 on the upper electrode 53 is composed of a conductive material having hydrogen barrier property, such that reducing gas such as hydrogen gas or the like can be prevented from penetrating into the charge storage section 5 from the side of the upper electrode 53.

The upper electrode 53 of the charge storage section 5 is connected to the ground line 92 through the ground line side upper plug 84, and the lower electrode 51 is connected to the bit line 91 through the base conductive section 55, the ground line side lower plug 82, the bit line side lower plug 81 and the bit line side upper plug 83, such that a voltage can be applied between the upper electrode 53 and the lower electrode 51, and a charge can be stored in the ferroelectric film 52 interposed between these electrodes. Accordingly, the charge storage section 5 can be functioned as a ferroelectric capacitor.

Also, as the switching transistor 3 is provided between the bit line side lower plug 81 and the ground line side lower plug 82, electrical signals transmitted from the bit line 91 to the charge storage section 5 can be turned on and off, such that the memory cell 1 equipped with the ferroelectric capacitor and the switching transistor 3 is capable of reading and writing data.

Next, a manufacturing method for manufacturing a ferroelectric capacitor in accordance with an embodiment of the invention is described, using an example in which the manufacturing method is applied to the manufacture of the memory cell 1 described above. It is noted that, in FIGS. 3A to 3D and FIG. 4 among the figures to be used for the following description, illustration of a part of the lower layer structure including the substrate 2 (see FIG. 1) is omitted.

Figure 2A:
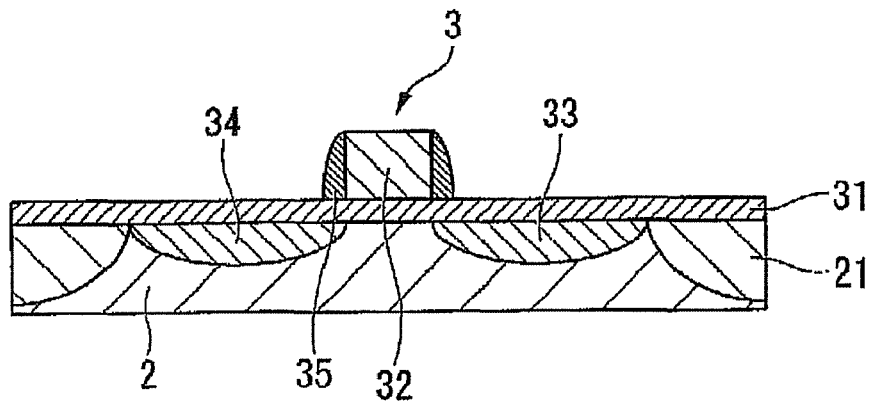
FIGS. 2A-2C are cross-sectional views schematically showing steps of a method for manufacturing a ferroelectric capacitor.

First, as shown in FIG. 2A, a switching transistor 3 is formed on a substrate 2. More specifically, element isolation regions 21 are formed by a LOCOS method at predetermined positions of the substrate 2 that may be composed of single crystal silicon or the like. By forming the element isolation regions 21, an area between the element isolation regions 21 defines a memory cell region. Then, a gate dielectric film 31 is formed on the substrate 2 by a thermal oxidation method or the like, and a gate electrode 32 composed of polycrystal silicon or the like is formed on the gate dielectric film 31. Impurity ions are injected in the substrate 2 between the gate electrode 32 and the element isolation regions 21 by an ion implanting method, thereby forming doped regions 33 and 34. Then, for example, a film of SiN is formed over the entire surface of the substrate 2, and the film is etched back to form a side wall 35. Then, impurity ions are injected again by an ion implanting method in the doped regions 33 and 34 between the element isolation regions 21 and the side wall 35, thereby increasing the ion concentration in these areas to form high concentration impurity regions (not shown). These regions may be formed by a known method.

Figure 2B:
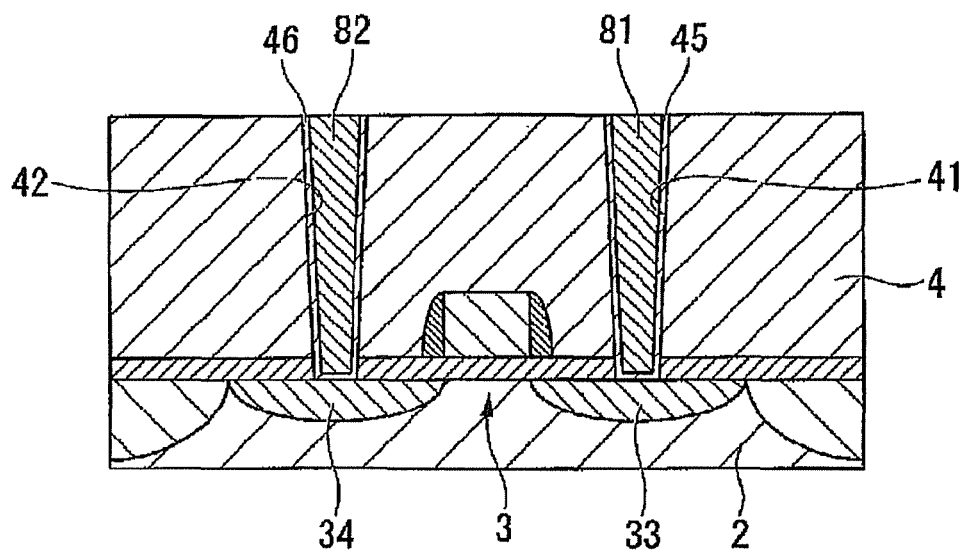

Next, as shown in FIG. 2B, a base dielectric film 4 is formed on the substrate 2 where the switching transistor 3 is formed, and then a bit line side lower plug 81 and a ground line side lower plug 82 are formed in predetermined positions in the base dielectric film 4. More specifically, the base dielectric film 4 is formed by a CVD method using, for example, TEOS as a source material. Then, for example, a positive type photoresist is formed on the base dielectric film 4, and portions of the photoresist corresponding to the doped regions 33 and 34 are exposed and developed, thereby removing these portions, whereby a resist pattern (not shown) is formed. Then, the base dielectric film 4 is etched by using the resist pattern as a mask, whereby contact holes 41 and 42 that connect to the doped regions 33 and 34 are formed.

Then, films of Ti and TiN are sequentially formed by, for example, a sputter method in the contact holes 41 and 42, thereby forming adhesion layers 45 and 46, respectively. Then, for example, a film of tungsten (W) is formed over the entire surface of the base dielectric film 4, thereby embedding tungsten in the contact holes 41 and 42. As the adhesion layers 45 and 46 are formed on the inner walls of the contact holes 41 and 42, the contact holes 41 and 42 can be embedded well with tungsten. Then, the tungsten film over the base dielectric film 4 is polished by a CMP method or the like until the base dielectric film 4 is exposed, thereby removing the Ti film, the TiN film and the tungsten film on the base dielectric film 4. In this manner, a bit line side lower plug 81 is formed in the bit line side lower contact hole 41, and a ground line side lower plug 82 is formed in the ground line side lower contact hole 42. These lower plugs may be formed by a known method.

Figure 2C:
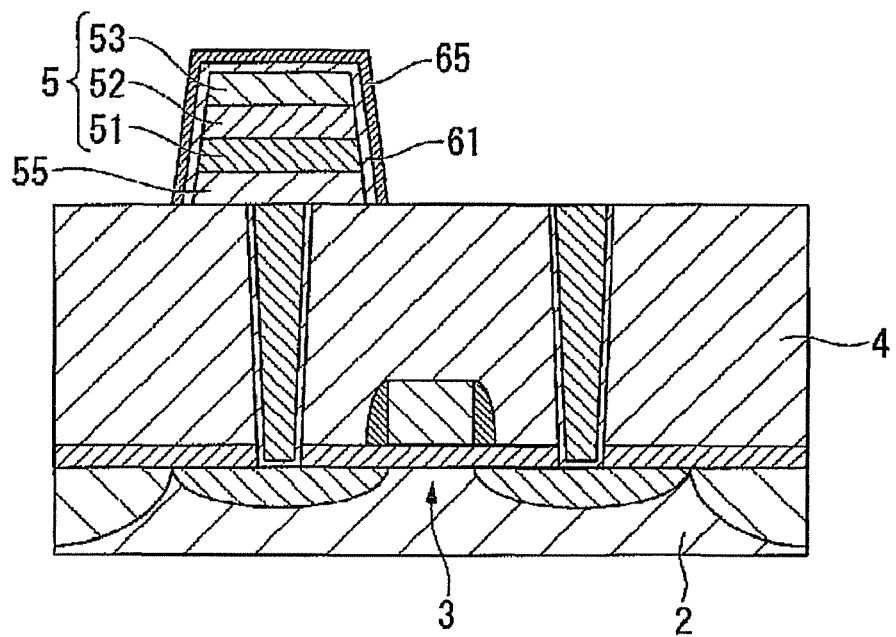

Next, as shown in FIG. 2C, a charge storage section 5 formed from a base conductive section 55, a lower electrode 51, a ferroelectric film 52 and an upper electrode 53 is formed on the base dielectric film 4. Then, a stopper film 61 that covers the charge storage section 5 is formed, and a hydrogen barrier film 65 that covers the stopper film 61 is formed. More specifically, first, for example, a film of titanium aluminum nitride (TiAlN) as the material for the base conductive section 55 is formed on the base dielectric film 4 by a sputter method. Then, for example, films of iridium (Ir), iridium oxide (IrOx) and platinum (Pt) as the material for the lower electrode 51 are sequentially formed on the film for the base conductive section by a sputter method. Then, for example, a film of lead zirconate titanate (Pb (Zi, Ti) $O_3$: hereafter referred to as "PZT") as the material for the ferroelectric film 52 is formed on the films for the lower electrode by a sol-gel method, a sputter method or the like. Then, for example, films of Pt, IrOx and Ir as the material for the upper electrode 53 are sequentially formed on the film for the ferroelectric film by a sputter method. Then, a resist pattern is formed by, for example, a photolithography method on the top surface of the these material films, in other words, on the film for the upper electrode 53, and the material films are etched using the resist pattern as a mask, whereby the base conductive section 55, and the charge storage section 5 having the lower electrode 51, the ferroelectric film 52 and the upper electrode 53 sequentially laminated on the base conductive section 55 are formed.

Then, for example, a film of silicon nitride (SiN) is formed on the entire surface of the base dielectric film 4 including the charge storage section 5 by a sputter method, and the film is patterned, whereby the stopper film 61 covering the charge storage section 5 is formed. By using the sputter method in this manner, a film of SiN can be formed in a non-reducing atmosphere, such that the stopper film 61 can be formed without reducing or deteriorating the ferroelectric film 52 of the charge storage section 5. Then, for example, a film of aluminum oxide (AlOx) is formed on the entire surface of the base dielectric film 4 including the stopper film 61 by a sputter method, and the film is patterned, whereby the hydrogen barrier film 65 covering the stopper film 61 is formed.

Figure 3A:
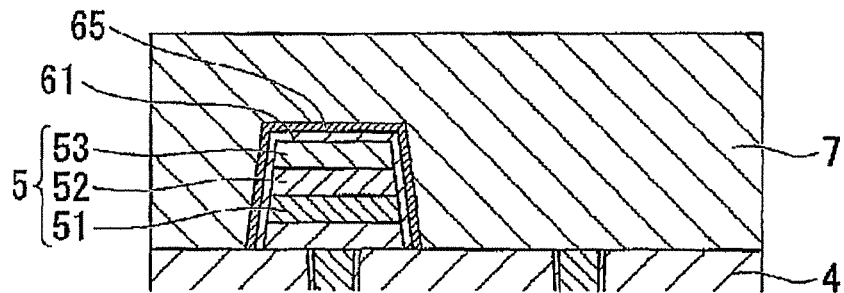
FIGS. 3A-3C are cross-sectional views schematically showing steps of the method for manufacturing a ferroelectric capacitor.

Next, as shown in FIG. 3A, an interlayer dielectric film 7 composed of $SiO_2$ is formed over the entire surface of the base dielectric film 4 including the hydrogen barrier film 65 by, for example, a CVD method using TEOS or the like as source material gas. In general, when the source material gas (TEOS) for the interlayer dielectric film 7 chemically reacts, reducing gas such as hydrogen gas and steam is generated. The ferroelectric film 52 of the charge storage section 5 is composed of PZT that is an oxide. Therefore, when the ferroelectric film 52 is reduced by the reducing gas, the ferroelectric property of the ferroelectric film 52 is damaged and the ferroelectric film 52 is deteriorated. However, according to the manufacturing method in accordance with the present embodiment, the hydrogen barrier film 65 that covers the charge storage section 5 is formed, and therefore the charge storage section 5 is not exposed to hydrogen gas. Accordingly, the interlayer dielectric film 7 can be formed without deteriorating the ferroelectric film 52.

Figure 3B:
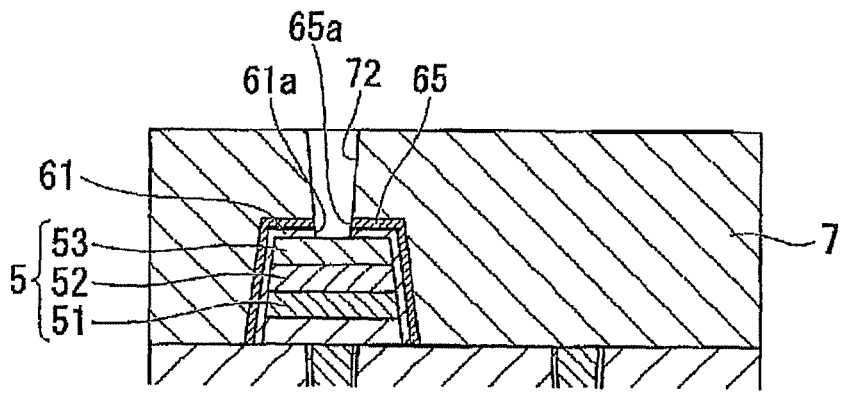

Next, for example, a positive type photoresist is formed on the interlayer dielectric film 7, and a portion of the photoresist corresponding to the upper electrode 53 is exposed and developed thereby removing the portion, whereby a resist pattern (not shown) is formed. Then, by using the resist pattern as a mask, the interlayer dielectric film 7, the hydrogen barrier film 65 and the stopper film 61 are sequentially etched by, for example, dry etching, whereby the upper electrode 53 is exposed. Then, the resist pattern (not shown) is subject to ashing treatment to form ash, and then the residues (organic pollutants) are removed by wet cleaning treatment, whereby the resist pattern is removed. As a specific example of the method of wet cleaning treatment, a method that uses a mixed solution of sulfuric acid and hydrogen peroxide aqueous solution (sulfuric acid/hydrogen peroxide aqueous solution) as the cleaning liquid (SPM cleaning), a method that uses a mixed solution of ammonia aqueous solution and hydrogen peroxide solution (ammonia/hydrogen peroxide aqueous solution) as the cleaning liquid (AMP cleaning) and the like may be used. According to the present embodiment, ammonia, hydrogen peroxide solution and water are mixed at an appropriate mixing ratio to form ammonia/hydrogen peroxide aqueous solution, and the ammonia/hydrogen peroxide aqueous solution is heated at about 75° C. to 85° C. to perform APM cleaning. In this manner, as shown in FIG. 3B, a second contact hole (ground line side upper contact hole) 72 that exposes the upper electrode 53 of the charge storage section 5 is formed in the interlayer dielectric film 7.

During the wet cleaning treatment, an opening side wall 65a of the hydrogen barrier film 65 exposed in the ground line side upper contact hole 72 is exposed to the ammonia/hydrogen peroxide aqueous solution (cleaning liquid), and may therefore be etched, whereby fine surface micro-roughness and crystal deficiency may expand, and a hollow-out portion (pit) may be generated in the opening side wall 65a. On the other hand, because the stopper film 61 is formed from SiN that is difficult to be dissolved by an ordinary cleaning liquid, such as, the ammonia/hydrogen peroxide aqueous solution, the opening side wall 61a of the stopper film 61 exposed in the ground line side upper contact hole 72 would hardly be etched, such that generation of hollow-out portions is prevented or substantially reduced, compared to the opening side wall 65a of the hydrogen barrier film 65.

Figure 3C:
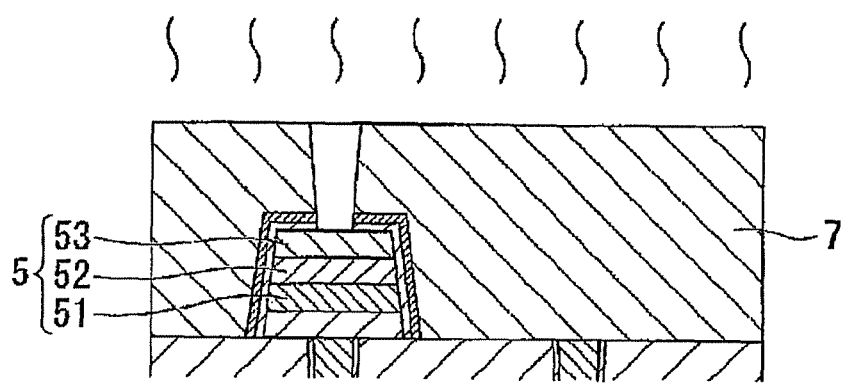

Next, in accordance with the present embodiment, as shown in FIG. 3C, the substrate 2 (see FIG. 1) where the ground line side upper contact hole 72 is formed is maintained in an oxygen atmosphere at 600° C. for five minutes, thereby performing annealing treatment. By so doing, the ferroelectric film 52 of the charge storage section 5 is thermally oxidized, and its oxygen deficiency can be recovered.

Figure 3D:
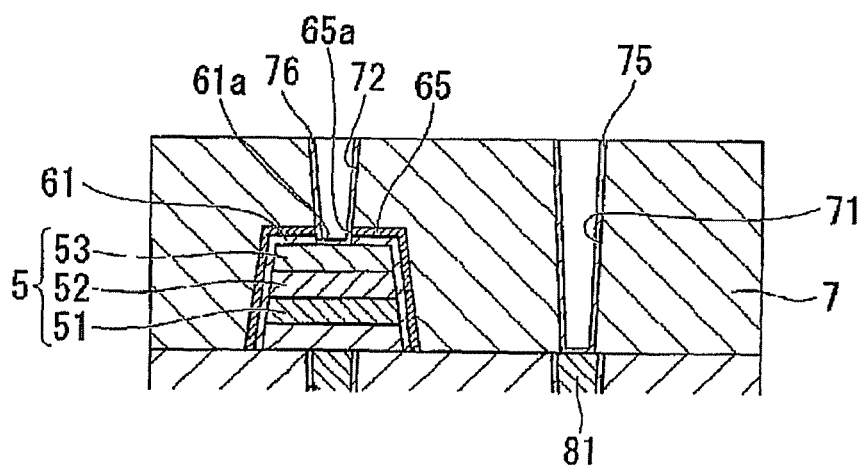

Then, as shown in FIG. 3D, a first contact hole (bit line side upper contact hole) 71 that exposes the first plug conductive section (bit line side lower plug) 81 is formed in the interlayer dielectric film 7, and adhesion layers 75 and 76 are formed in the bit line side upper contact hole 71 and the ground line side upper contact hole 72, respectively. More specifically, like the ground line side upper contact hole 72, a resist pattern (not shown) is formed on the interlayer dielectric film 7, and the interlayer dielectric film 7 is etched by using the resist pattern as a mask. Then, the resist pattern is removed by ashing treatment and wet cleaning treatment. Here, a hollow-out portion is also generated in the opening side wall 65a of the hydrogen barrier film 65 as being exposed to the cleaning liquid as described above. Also, a hollow-out portion generated at the time of forming the ground line side upper contact hole 72 may become more prominent at the time of forming the bit line side upper contact hole 71, and the adhesion force in an area between the hydrogen barrier film 65 and the stopper film 61 may be deteriorated, whereby peeling may occur in this area.

Then, for example, films of Ti and TiN are sequentially formed by a sputter method on the entire inner wall of the bit line side upper contact hole 71 including the exposed surface of the bit line side lower plug 81, and on the entire inner wall of the ground line side upper contact hole 72 including the exposed surface of the upper electrode 53, whereby adhesion layers 75 and 76 are formed. In this manner, according to the present embodiment, the adhesion layer 76 is formed to cover not only the exposed surface of the upper electrode 53 but also the entire inner wall of the ground line side upper contact hole 72. As described above, hollow-out portions and peeling are generated in the opening side wall 65a of the hydrogen barrier film 65, and the coverage of the material (Ti, TiN) of the adhesion layer 76 in such hollow-out portions is damaged, such that weak points corresponding to the hollow-out portions in the hydrogen barrier film 65 are generated in the adhesion layer 76. On the other hand, no hollow-out portion is generated in the opening sidewall 61a of the stopper film 61, such that weak points are prevented from being generated in the adhesion layer 76 in portions corresponding to the opening sidewall 61a of the stopper film 61.

Figure 4A:
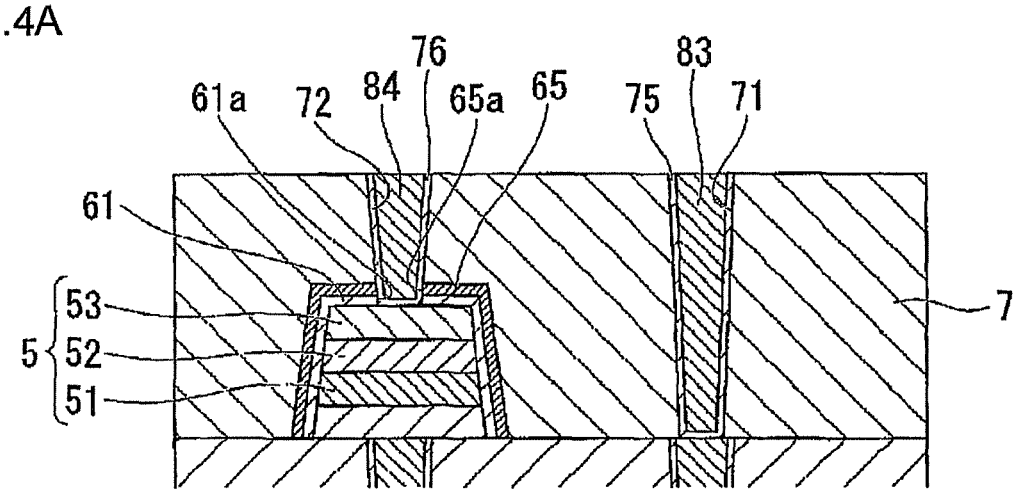

Next, as shown in FIG. 4A, a bit line side upper plug (second plug conductive section) 83 is formed in the bit line side upper contact hole 71 including the adhesion layer 75, and a ground line side upper plug (third plug conductive section) 84 is formed in the ground line side upper contact hole 72 including the adhesion layer 76. More specifically, for example, a film of tungsten is formed by a CVD method over the entire surface of the interlayer dielectric film 7, thereby embedding tungsten in the contact holes 71 and 72. As the adhesion layers 75 and 76 are formed on the inner walls of the contact holes 71 and 72, the contact holes 71 and 72 can be embedded well with tungsten. Normally, the film of tungsten is formed in a reducing atmosphere. However, the adhesion layer 76 composed of a material having hydrogen barrier property is formed in a manner to cover the upper electrode 53, such that the reducing gas such as hydrogen gas is prevented from penetrating into the charge storage section 5 through the adhesion layer 76, whereby reduction and deterioration of the ferroelectric film 52 are prevented.

Then, the tungsten film over the interlayer dielectric film 7 is polished by a CMP method until the top surface of the interlayer dielectric film 7 is exposed, thereby removing the tungsten film, the Ti film, the TiN film and the like on the interlayer dielectric film 7, and forming a bit line side upper plug 83 in the bit line side upper contact hole 71, and a ground line side upper plug 84 in the ground line side upper contact hole 72.

Figure 4B:
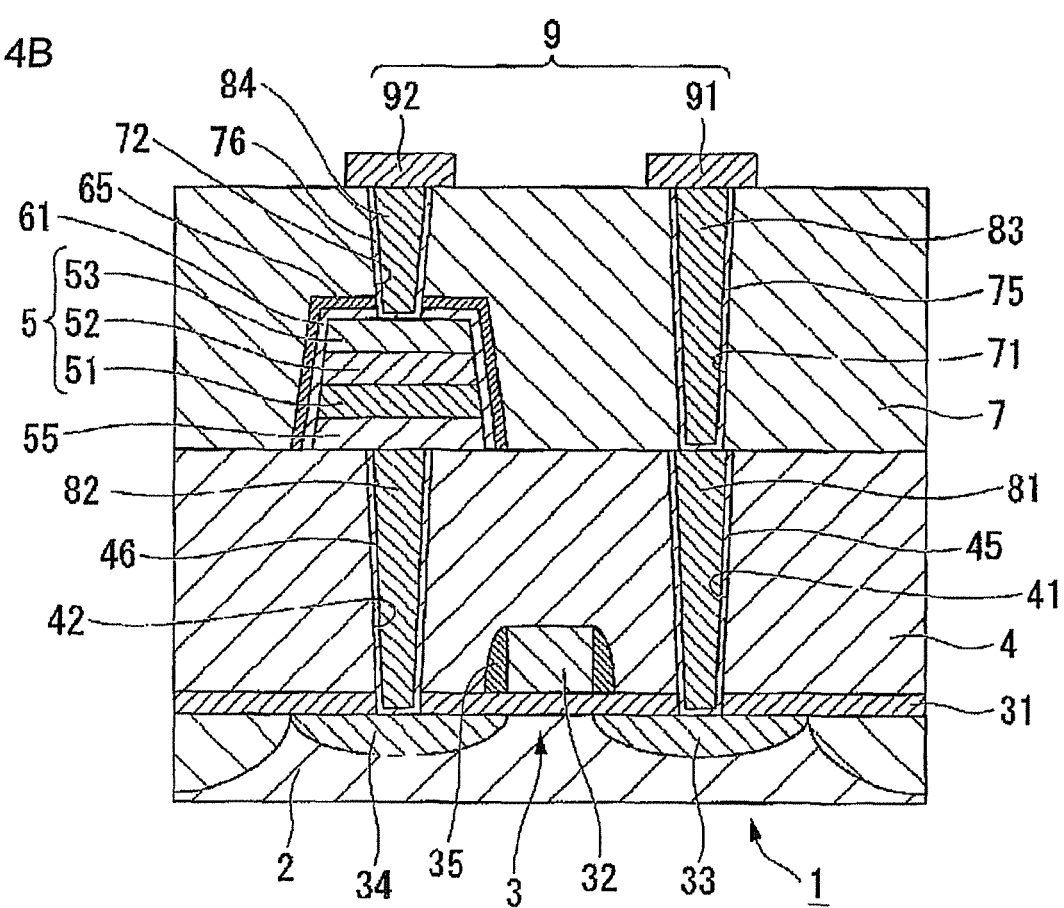

Next, as shown in FIG. 4B, a wiring pattern 9 is formed on the interlayer dielectric film 7. More specifically, for example, a film of aluminum (Al) is formed by a sputter method on the interlayer dielectric film 7. Then, a photoresist is formed on the Al film, and a predetermined portion of the photoresist is exposed and developed to form a resist pattern (not shown). Then, by using the resist pattern as a mask, the Al film is etched, whereby the wiring pattern 9 is formed. According to the present embodiment, the wiring pattern 9 that connects to the ground line side upper plug 84 on the charge storage section 5 defines a ground line 92, and the wiring pattern 9 that connects to the bit line side upper plug 83 defines a bit line 91. In this manner, the memory cell 1 is manufactured.

According to the manufacturing method for manufacturing a ferroelectric capacitor in accordance with the embodiment of the invention, the stopper film 61 is formed in contact with the upper electrode 53 of the charge storage section 5, and the stopper film 61 is formed from a material that is more difficult to be etched than the hydrogen barrier film 65, such that generation of hollow-out portions in the opening sidewall 61a of the stopper film 61 is prevented. Accordingly, generation of weak points in the adhesion layer 76 within the ground line side upper contact hole 72 in a portion corresponding to at least the opening sidewall 61a of the stopper film 61 is prevented.

According to the method in related art, a hydrogen barrier film is formed in contact with the upper electrode. As described above, hollow-out portions and the like are generated in the opening sidewall of the hydrogen barrier film due to the cleaning treatment to remove the resist pattern, and weak points are generated in the adhesion layer above the upper electrode in a portion corresponding to the hollow-out portions. Accordingly, when a ground line side upper plug is formed, reducing gas penetrates into the charge storage section through the weak points, whereby the ferroelectric film is reduced and deteriorated.

However, according to the method in accordance with the invention, the stopper film 61 is formed in contact with the upper electrode 53, thereby preventing weak points from being generated at the contact portion between the adhesion layer 76 and the upper electrode 53. Therefore, at the time of forming the ground line side upper plug 84, deterioration of the ferroelectric film 52 by reducing gas, which would otherwise have penetrated into the charge storage section 5 through weak points, can be prevented.

It is noted that a hollow-out portion may be generated in the opening sidewall 65a of the hydrogen barrier film 65 in the method of the invention. However, even when weak points are generated in the adhesion layer 7 due to the hollow-out portion, reducing gas that has passed through the weak points flows between the hydrogen barrier film 65 and the stopper film 61 because the weak points are located at positions corresponding to the opening sidewall 65a of the hydrogen barrier film 65. Accordingly, the reducing gas that has penetrated the stopper film may enter in a very small amount into the charge storage section 5, such that deterioration of the ferroelectric film 52 can be reduced. Also, by forming the stopper film 61 from a material having hydrogen barrier property, like the present embodiment, reducing gas does not penetrate into the stopper film 61, and therefore deterioration of the ferroelectric film 52 can be securely prevented.

Also, according to the method in accordance with the present embodiment, the ground line side upper contact hole 72 is formed, and thereafter anneal treatment is conducted in an oxygen atmosphere. Therefore, even when the ferroelectric film 52 has been reduced in a process before the anneal treatment, its oxygen deficiency can be recovered, and the ferroelectric film 52 can be obtained with excellent ferroelectric characteristics.

According to the ferroelectric capacitor in accordance with the embodiment of the invention manufactured by the method described above, even when the ferroelectric film 52 is reduced and deteriorated before forming the ground line side upper plug 84, its oxygen deficiency can be recovered by anneal treatment, and the ferroelectric film 52 can be obtained with excellent ferroelectric characteristics. Furthermore, generation of weak points in the adhesion layer 76 in a portion that is in contact with the upper electrode 53 is prevented, such that, at the time of forming the ground line side upper plug 84, deterioration of the ferroelectric film 52 by reducing gas, which would otherwise have entered the charge storage section 5 through weak points, is prevented. In this manner, the ferroelectric capacitor equipped with the ferroelectric film 52 that has excellent ferroelectric characteristics and prevents its deterioration has excellent hysteresis characteristics.

In accordance with the present embodiment, the wiring pattern 9 on the side of the upper electrode 53 of the charge storage section 5 forms the ground line 91, but may be formed as a bit line. Furthermore, for example, when a wiring, such as, a word line or the like is formed on the interlayer dielectric film 7, and is connected to the gate electrode 32 through a plug, the plug can also be formed in a similar manner as the second plug conductive section 83.

Also, the tungsten film, the Ti film, the TiN film and the like on the interlayer dielectric film 7 may be removed together with portions of the Al film to be removed in the step of etching the Al film when forming the wiring pattern 9, instead of being removed by a CMP method.

What is claimed is:

1. A method for manufacturing a ferroelectric capacitor, comprising:
   forming a base dielectric film on a substrate,
   forming a first plug conductive section in the base dielectric film at a predetermined position;
   forming, on the base dielectric film, a charge storage section formed from a lower electrode, a ferroelectric film and an upper electrode;
   forming a stopper film from an insulation material that covers the charge storage section;
   forming a hydrogen barrier film that covers the stopper film;
   forming an interlayer dielectric film on the base dielectric film including the hydrogen barrier film;
   forming, in the interlayer dielectric film, a first contact hole that exposes the first plug conductive section;
   forming a second contact hole that exposes the upper electrode of the charge storage section by successively etching the interlayer dielectric film, the hydrogen barrier film and the stopper film by using a resist pattern as a mask, and then removing the resist pattern by a wet cleaning treatment;

forming an adhesion layer from a conductive material having hydrogen barrier property inside the second contact hole in a manner to cover an upper surface of the upper electrode;

forming a second plug conductive section inside the first contact hole; and forming a third plug conductive section inside the second contact hole, wherein the stopper film is formed from a material having a lower etching rate for a cleaning liquid used for the wet cleaning treatment to remove the resist pattern than an etching rate of the hydrogen barrier film for the cleaning liquid.

2. A method for manufacturing a ferroelectric capacitor according to claim 1, the stopper film including a material having hydrogen barrier property.

3. A method for manufacturing a ferroelectric capacitor according to claim 1, the stopper film including SiN.

4. A method for manufacturing a ferroelectric capacitor according to claim 1, the forming of the stopper film including a sputter method.

5. A method for manufacturing a ferroelectric capacitor according to claim 1, the forming of the second contact hole being conducted before the forming of the first contact hole, and further comprising conducting an anneal treatment in an oxygen atmosphere between the forming of the second contact hole and the forming of the first contact hole.

6. A method for manufacturing a ferroelectric capacitor, comprising:

forming a base dielectric film on a substrate;

forming, on the base dielectric film, a charge storage section formed in an order of a lower electrode, a ferroelectric film, and an upper electrode;

forming a stopper film that covers the charge storage section;

forming a hydrogen barrier film that covers the stopper film;

forming an interlayer dielectric film on the base dielectric film such that the interlayer dielectric film covers the hydrogen barrier film;

forming a contact hole that exposes a portion of the upper electrode of the charge storage section by etching the interlayer dielectric film, the hydrogen barrier film, and the stopper film by using a resist pattern as a mask, and then removing the resist pattern by a wet cleaning treatment; and forming a plug conductive section inside the contact hole, wherein the stopper film includes a material having a lower etching rate relative to a cleaning liquid used for the wet cleaning treatment to remove the resist pattern than an etching rate of the hydrogen barrier film relative to the cleaning liquid.

* * * * *